(12) United States Patent
Osvaldella

(10) Patent No.: US 7,567,136 B2
(45) Date of Patent: *Jul. 28, 2009

(54) RING OSCILLATOR CIRCUIT

(75) Inventor: Mauro Osvaldella, La Spezia (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 11/836,250

(22) Filed: Aug. 9, 2007

(65) Prior Publication Data

US 2007/0273451 A1 Nov. 29, 2007

Related U.S. Application Data

(62) Division of application No. 11/112,756, filed on Apr. 22, 2005, now Pat. No. 7,265,638.

(30) Foreign Application Priority Data

May 6, 2004 (IT) .......................... MI2004A0918

(51) Int. Cl.
*H03K 3/03* (2006.01)
(52) U.S. Cl. ..................... 331/57; 331/177 R
(58) Field of Classification Search .................. 331/57, 331/177 R, 179
See application file for complete search history.

(56) References Cited

U.S. PATENT DOCUMENTS

| | | | |
|---|---|---|---|
| 4,458,165 A | | 7/1984 | Jackson |
| 4,691,124 A | | 9/1987 | Ledzius et al. |
| 5,617,454 A | | 4/1997 | Gotz et al. |
| 5,708,381 A | * | 1/1998 | Higashisaka ................. 327/276 |
| 5,933,058 A | * | 8/1999 | Pinto et al. ..................... 331/17 |
| 6,094,081 A | * | 7/2000 | Yanagiuchi ................. 327/258 |
| 6,184,754 B1 | | 2/2001 | Kaneko |
| 7,265,638 B2 | * | 9/2007 | Osvaldella ..................... 331/57 |
| 2004/0051593 A1 | | 3/2004 | Carpenter et al. |
| 2004/0160282 A1 | * | 8/2004 | Kim ............................ 331/57 |
| 2004/0189406 A1 | | 9/2004 | Shah et al. |

* cited by examiner

*Primary Examiner*—Robert Pascal
*Assistant Examiner*—Ryan J. Johnson
(74) *Attorney, Agent, or Firm*—Hogan & Hartson LLP

(57) ABSTRACT

A ring oscillator circuit includes a ring of cascade-coupled delay stages and is controlled by a plurality of multiplexers. A feedback circuit has an input terminal coupled to an output terminal of the ring oscillator circuit. The ring oscillator circuit receives a control word and provides a clock signal on the output terminal. The ring oscillator circuit includes a control architecture including a plurality of control blocks receiving respective bits of the control word and coupled to the delay stages of the ring. Each control block has at least a bistable element capable of receiving, storing and sending a bit of the control word to a multiplexer coupled to a respective delay stage in stable operating conditions of the ring.

12 Claims, 2 Drawing Sheets

US 7,567,136 B2

RING OSCILLATOR CIRCUIT

RELATED APPLICATIONS

The present application is a divisional of co-pending U.S. patent application Ser. No. 11/112,756 filed Apr. 22, 2005 which claims priority of Italian Patent Application No. MI2004A000918 filed May 6, 2004, both of which are incorporated herein their entireties by this reference.

BACKGROUND OF THE INVENTION

1. Field of the Invention

The present invention relates to a ring oscillator circuit. More specifically, the invention relates to a ring oscillator circuit including a ring of cascade-connected delay stages, controlled by a plurality of multiplexers and fed back by a feedback logic gate having an input terminal connected to an output terminal of said ring oscillator circuit, said ring oscillator circuit receiving a control word and emitting on said output terminal a clock signal. The invention relates particularly, but not exclusively, to a ring oscillator circuit for phase locking systems and the following description is made with reference to this field of application for convenience of illustration only.

2. State of the Art

As it is well known, oscillator circuits are usually realized by rings of delay stages connected and driven by multiplexers. A possible application of these ring oscillator circuits is in phase locking systems used in low-voltage power supplies. In particular, these advanced phase locking systems require stable oscillators that can be varied in frequency by a control signal. It is also possible to use ring oscillator circuits in FM demodulators, clock generators for microcontrollers and for serial transmissions.

FIG. 1 shows a ring oscillator circuit realized according to the prior art, globally and schematically indicated with 1. The ring oscillator circuit 1 comprises a plurality of cascade-connected elementary delay stages 3, controlled by a plurality of multiplexers 2 and fed back in a ring 4 by means of a logic gate 5 and a feedback delay stage 6.

For convenience of illustration, FIG. 1 shows a ring oscillator circuit 1 comprising three elementary delay stages 3, indicated with 3-1, 3-2 and 3-3, connected by means of three multiplexers 2, indicated with 2-1, 2-2 and 2-3. A first delay stage 3-1 has an input terminal directly connected to the feedback delay stage 6 and an output terminal connected to a first input terminal of a first multiplexer 2-1, having a second input terminal directly connected to the feedback delay stage 6 by means of a first fast line 7-1.

The first multiplexer 2-1 has also a control terminal receiving a first bit C0 of a control word and an output terminal connected to a second delay stage 3-2. Similarly to the first delay stage 3-1, this second delay stage 3-2 has an output terminal connected to a first input terminal of a second multiplexer 2-2.

The second multiplexer 2-2 has a second input terminal connected by means of a second fast line 7-2 to the output terminal of the first multiplexer 2-1, as well as a control terminal receiving a second bit C1 of the control word and an output terminal connected to a third delay stage 3-3. This third delay stage 3-3 has an output terminal connected to a first input terminal of a third multiplexer 2-3, having in turn a second input terminal connected by means of a third fast line 7-3 to the output terminal of the second multiplexer 2-2, as well as a control terminal receiving a third bit C2 of the control word. The third multiplexer 3-3 has also an output terminal connected to a first input terminal of the logic gate 5, having in turn a second input terminal receiving an external reset signal RESET and an output terminal connected to the feedback delay stage 6.

A clock signal CK is generated on the output terminal of the third multiplexer 2-3, corresponding to an output terminal OUT of the ring oscillator circuit 1. Moreover, the delay stages 3-1, 3-2 and 3-3 comprise an increasing number of elementary delay cells 8, realized by single logic gates (NAND, NOR etc.), or in a 'standard cell', not being dedicated to any particular application.

The ring oscillator circuit 1 realized according to the prior art is programmable by changing the control word C0-C2 sent to multiplexers 2. Reference is made to a digitally-controlled oscillator (DCO, or "Digital Controlled Oscillator"), which can be integrated in a completely digital technology and used in applications which cannot use analog circuits, such as completely digital phase locking rings.

The frequency of the ring oscillator circuit 1 is varied by dividing by a programmable number a starting frequency value. In this case, a very high starting frequency value must be provided to obtain good resolution.

The design and realization of a digital divider for a value N is not simple for the frequency values that would be required.

It is also possible to realize the ring oscillator circuit 1 by using tristate elements. In this case it is, however, difficult to obtain high frequency values together with wide frequency variation ranges. Moreover, changing the control word during the normal operation of the ring oscillator circuit 1 leads to the generation of spurious pulses in the ring 4, invalidating the correct operation of the ring oscillator circuit 1.

To avoid the generation of these spurious pulses, the operation of the ring oscillator circuit 1 must be stopped by using the signal RESET to change the control word in stable conditions.

This is a major limitation of the ring oscillator circuit 1 realized according to the prior art, because the circuit shutdown and thus the interruption of the clock signal CK generation is unacceptable in many applications.

The technical problem underlying the present invention is to provide a ring oscillator circuit, having such structural and functional features to overcome the limits still affecting the circuits realized according to the prior art.

SUMMARY OF THE INVENTION

According to an embodiment of the present invention, a control circuit comprising a plurality of control blocks associated with the ring oscillator circuit delay stages is used, which is capable of stopping the update of the control word bits up to the concerned delay stage switching.

According to an embodiment of the present invention, a ring oscillator circuit comprises a ring of cascade-connected delay stages, controlled by a plurality of multiplexers and fed back by a feedback logic gate having an input terminal connected to an output terminal of said ring oscillator circuit, said ring oscillator circuit receiving a control word and emitting a clock signal on said output terminal, characterized in that it comprises a control architecture comprising in turn a plurality of control blocks receiving respective bits of said control word and connected to said delay stages of said ring, each control block comprising at least a bistable element capable of receiving, storing and sending a bit of said control word to a multiplexer connected to a respective delay stage in stable operating conditions of said ring.

The features and advantages of the ring oscillator circuit according to the invention will be apparent from the following

DETAILED DESCRIPTION

Figure 1:
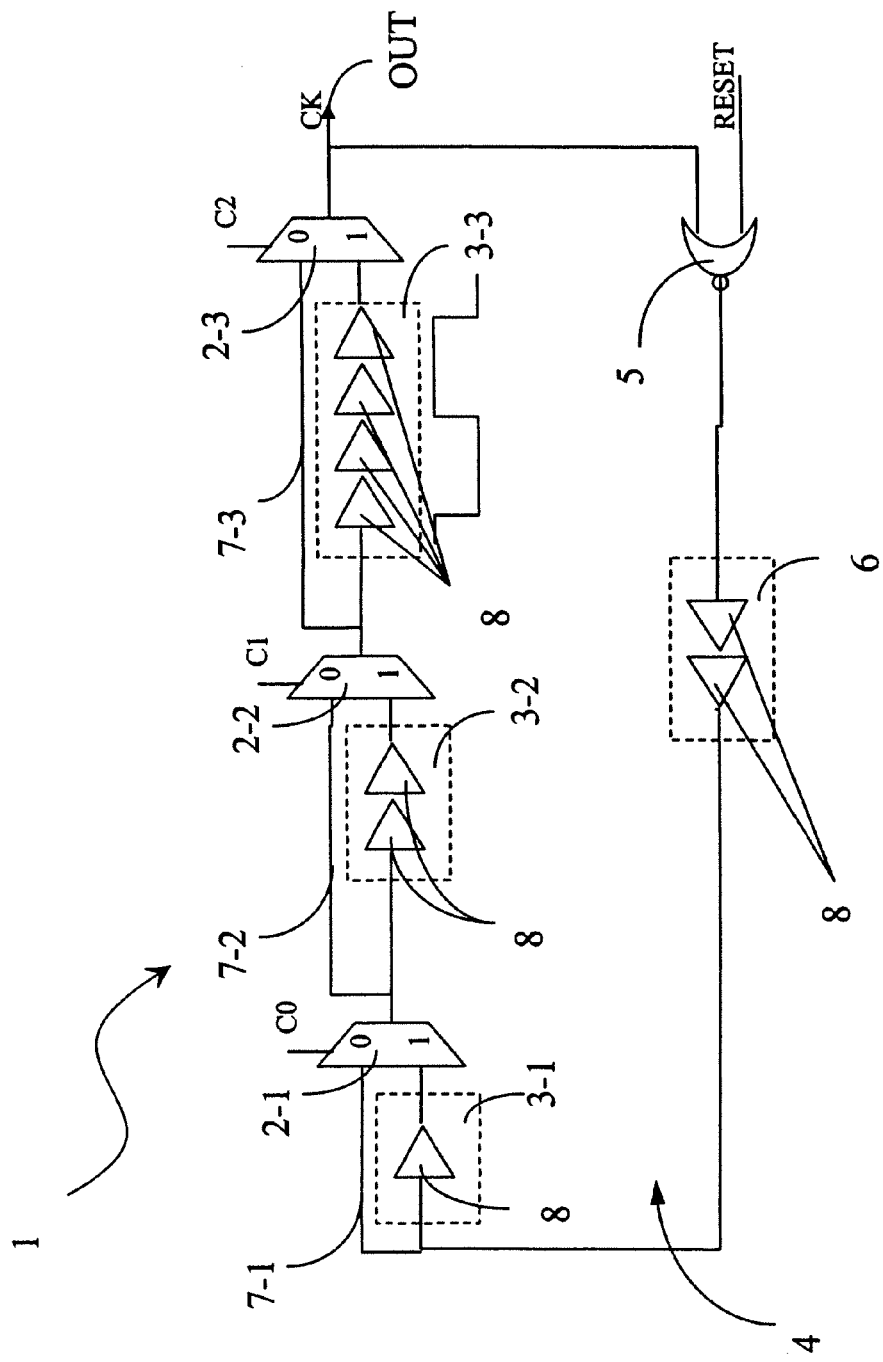
FIG. 1 shows a ring oscillator circuit realized according to the prior art.
Figure 2:
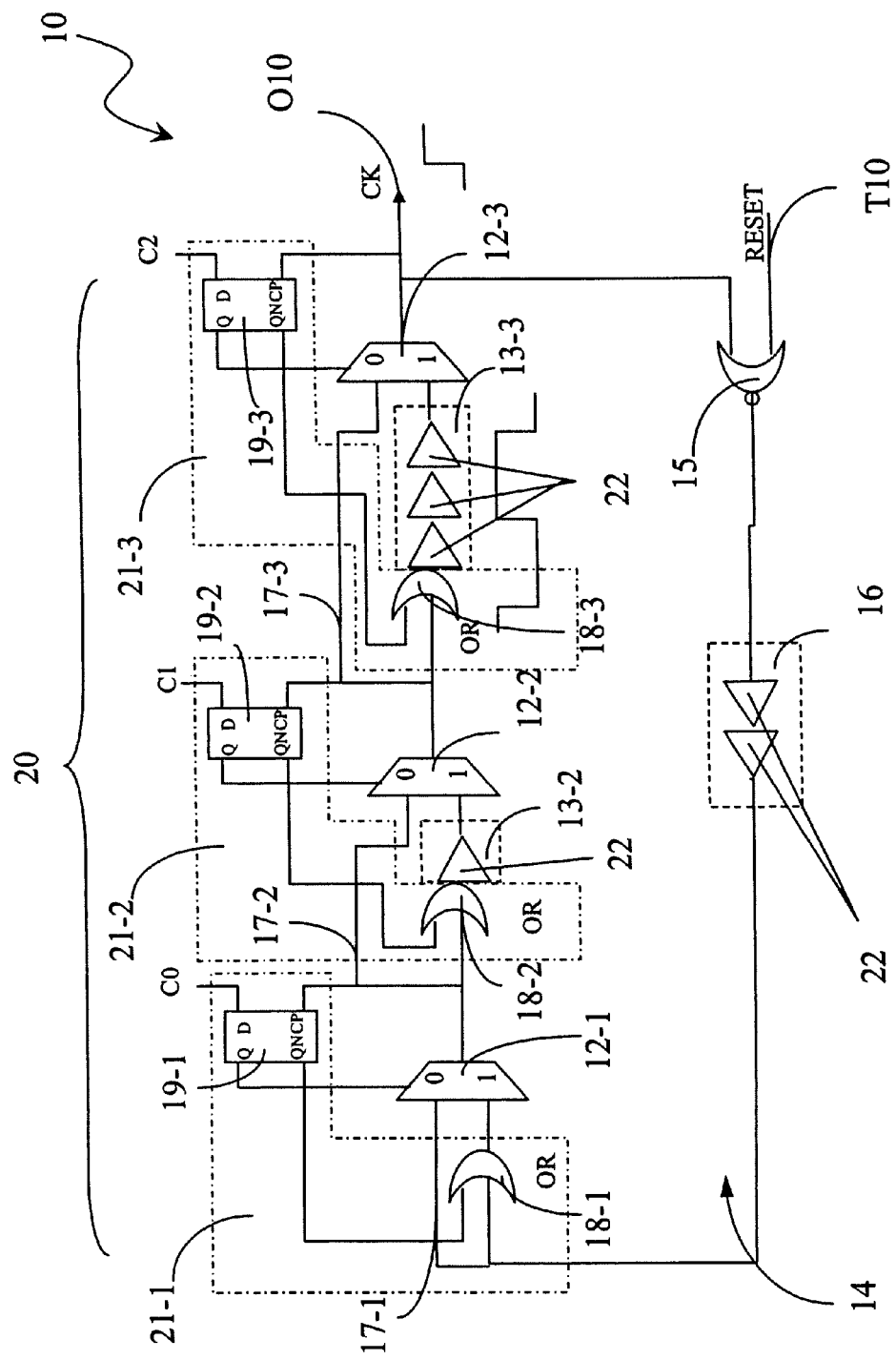
FIG. 2 shows a ring oscillator circuit realized according to the invention.

With reference to the drawings, and particularly to FIG. 2, a ring oscillator circuit 10 realized according to the invention is now described.

Similarly to what has been described with reference to the prior art, the ring oscillator circuit 10 comprises a plurality of cascade-connected delay stages 13, controlled by a plurality of multiplexers 12 and fed back in a ring 14 by means of a logic gate 15 and a feedback delay stage 16.

Advantageously according to an embodiment of the invention, the ring oscillator circuit 10 also comprises a control architecture 20 comprising in turn a plurality of control blocks 21 connected to the elementary delay cells 13 and to the multiplexers 12 of the ring 14 and receiving respective bits C0-C2 of a control word.

The control blocks 21 comprise respective logic gates 18 capable of stopping the connections between delay stages 13 and multiplexers 12 and thus the transmission of a bit of the control word up to the switching of a flip-flop 19 comprised in each block 21 and receiving this bit, thus ensuring a stable condition before each variation of the control word bits.

In particular, each control block 21 comprises an OR logic gate 18 inserted in the ring 14 and connected to a D-type flip-flop 19. The logic gate 18 has a first input terminal connected to an output terminal of a multiplexer 12 preceding it in the ring 14 or to the feedback delay stage 16 in the case of a first control block 21 of the architecture 20 connected to a first stage 13 of the ring 14, a second input terminal connected to a first input terminal of the flip-flop 19 of the same control block 21 and an output terminal connected to an input terminal of a delay stage 13 whereto this control block 21 is associated. The flip-flop 19 has also a second input terminal connected to a control terminal of the driving multiplexer 12 of the delay stage 13 whereto this control block 21 is associated, an output terminal connected to an output terminal of the multiplexer 12, as well as a control terminal receiving a control word bit.

The output terminal of the control block 21 is also connected to a fast line 17 corresponding to a following delay stage in the ring 14, as well as to an input terminal of a logic gate inserted in a control block connected to this following delay stage in the ring 14.

The control word bit enables or disables, by multiplexers 12, the delay stage 13 according to the weight thereof, i.e. the bit position (for example a third bit C2 of the control word controls, by means of the third multiplexer 12-3, the third delay stage 13-3).

The flip-flop 19 operates as a memory element receiving the control word bit and sending it (thus updating the control word) to the corresponding multiplexer 12 only when a rising front of a clock signal passing through the ring 14 has just overcome the delay stage 13 whereto the control block 21 comprising this flip-flop 19 is associated. Afterwards, the delay stage 13 is kept stable, by disabling it by means of the multiplexer 12.

It is worth noting that the delay stage shutdown is required only when the control signal of the multiplexer 12 corresponds to a low logic value or logic "0". In fact, in this case, the output on a terminal QN of the flip-flop 19 corresponds to a high logic value or logic "1" and thus the logic gate 18, which in the example shown in the FIG. is of the OR type, forces the delay stage 13 to "1". Under these conditions, the switching of the multiplexer 12 (shift of the control signal from "0" to "1") certainly occurs with the two inputs of the multiplexer 12 steadily being both at "1".

In fact the flip-flop 19, to change the control signal of the multiplexer 12, requires a rising front, i.e. a shift from a value "0" to a value "1".

On the contrary, the inverse switching of the multiplexer 12, from the value "1" to a value "0", does not pose problems.

Therefore, the ring oscillator circuit 10 allows the control word to be updated without generating spurious pulses in the ring 14.

In other words, the ring oscillator circuit 10 according to an embodiment of the invention realizes a digitally controlled oscillator circuit comprising a ring 14 of delay stages 13 comprising standard cells. The presence of the control architecture 20 allows the control word to be changed while the oscillator circuit 10 is operating, updating this control word bit by bit and only when a clock signal rising front reaches the corresponding flip-flop 19. The logic gate 18 sets the value on an input branch of a multiplexer 12 of a delay stage 13 when unselected, ensuring a stable situation upstream of each bit.

In the embodiment shown in FIG. 2, the ring oscillator circuit 10 comprises two delay stages 13, indicated with 13-2 and 13-3, driven by means of three multiplexers 12, indicated with 12-1, 12-2 and 12-3.

As it will be seen in the following description, a first delay stage 13-1 is realized by means of a first logic gate 18-1 inserted in a first control block 21-1 of the architecture 20.

In fact, a first multiplexer 12-1 has a first input terminal directly connected to an output terminal of the first logic gate 18-1 comprised in the first control block 21-1, having in turn a first input terminal connected to a first input terminal of a first flip-flop 19-1 comprised in the first control block 21-1 and a second input terminal directly connected to the feedback delay stage 16.

The first multiplexer 12-1 has also a second input terminal directly connected to the feedback delay stage 16 by means of a first fast line 17-1, as well as a control terminal connected to a second input terminal of the first flip-flop 19-1.

The first flip-flop 19-1 has a control terminal receiving a first bit C0 of a control word and an output terminal connected to an output terminal of the first multiplexer 12-1.

In the embodiment shown in the FIG. 2, the first logic gate 18-1 thus serves also as a first delay stage 13-1 of the ring 14 of the ring oscillator circuit 10 according to the invention. It is however possible to provide a ring oscillator circuit 1 comprising further elementary cells in the first delay stage 13-1.

The output terminal of the first multiplexer 12-1 is further connected to a second control block 21-2 of the architecture 20, associated to a second stage 13-2 of the ring 14.

In particular, this second delay stage 13-2 has an input terminal connected to an output terminal of a second logic gate 18-2 of the second control block 21-2 and an output terminal connected to a first input terminal of a second multiplexer 12-2.

The second logic gate 18-2 has in turn a first input terminal connected to a first input terminal of a second flip-flop 19-2 comprised in the second control block 21-2 and a second input terminal to the output terminal of the first multiplexer 12-1 and to the output terminal of the first flip-flop 19-1.

Moreover, the second multiplexer 12-2 has a second input terminal connected, by means of a second fast line 17-2, to the output terminal of the first multiplexer 12-1 and to the output terminal of the first flip-flop 19-1, as well as a control terminal connected to a second input terminal of the second flip-flop 19-2.

The second flip-flop 19-2 has also a control terminal receiving a second bit C1 of the control word and an output terminal connected to an output terminal of the second multiplexer 12-2.

The output terminal of the second multiplexer 12-2 is further connected to a third control block 21-3 of the architecture 20, associated to a third delay stage 13-3 of the ring 14.

The third delay stage 13-3 has in particular an input terminal connected to an output terminal of a third logic gate 18-3 of the third control block 21-3 and an output terminal connected to a first input terminal of a third multiplexer 12-3.

The third logic gate 18-3 has in turn a first input terminal connected to a first input terminal of a third flip-flop 19-3 comprised in the third control block 21-3 and a second input terminal to the output terminal of the second multiplexer 12-2 and to the output terminal of the second flip-flop 19-2.

Moreover, the third multiplexer 12-3 has a second input terminal connected, by means of a third fast line 17-3, to the output terminal of the second multiplexer 12-2 and to the output terminal of the second flip-flop 19-2, as well as a control terminal connected to a second input terminal of the third flip-flop 19-3.

The third flip-flop 19-3 has also a control terminal receiving a third bit C2 of the control word and an output terminal connected to an output terminal of the third multiplexer 12-3.

The output terminal of the third multiplexer 12-3 corresponds to an output terminal O10 of the ring oscillator circuit 10.

The output terminal O10 is connected to a first input terminal of the logic gate 15, having in turn a second input terminal connected to the external terminal T10 receiving an external reset signal RESET, as well as an output terminal connected to the feedback delay stage 16.

It is worth noting that the delay stages 13-2 and 13-3 of the ring oscillator circuit 10 according to the invention comprise an increasing number of elementary delay cells 22.

A clock signal CK is generated on the output terminal O10 of the ring oscillator circuit 10.

A digitally controlled oscillator circuit is thus obtained, comprising a ring 14 of delay stages 13 comprising standard elementary cells equipped with a control architecture 20, comprising in turn a plurality of control blocks 21 capable of regulating the updates of the control word bits only in stable conditions, i.e. only when a rising front reaches flip-flops 19.

In fact, as long as the signal RESET has a high logic value or logic "1", the whole ring 14 is in a stable condition and the clock signal CK on the output terminal O10 is at a low logic value or logic "0". When the signal RESET shifts to a logic value "0", the output terminal of the logic gate 15 of the NOR type switches to a logic value "1" and it propagates a positive front which, after a time T, lets the clock signal CK switch on the output terminal O10.

It should be noted that this time T is a half cycle of the clock signal CK and it depends on the number of delay stages it covers. These delay stages have increasing weights and corresponding to 1*Tp, 2*Tp, 4*Tp, being Tp the delay of an elementary cell, i.e. the rising front propagation time through a logic gate. The half cycle T, due to the single elementary delay cells, is thus given by Tp*(c), being c the digital representation of the control signal bit (000->0, 001->1, 010->2, 011->3, ..., 111->7).

Advantageously according to an embodiment of the invention, the logic gates 18 of the OR type keep the delay stages 13 locked when unselected at a logic value "1", ensuring a stable situation upstream of each bit.

The ring oscillator circuit 10 according to the invention allows digitally controlled oscillator circuits (DCO) to be realized, being completely digital and using only standard elementary cells. Therefore, the ring oscillator circuit 10 according to the invention can be described in the VHDL and synthesized, and thus easily movable on different integration technologies, i.e. shiftable, by means of a software processing called synthesis, from a word-made text description which can be easily read, understood and above all technology-independent, to a set of logic gates belonging to a specific technology implementing the textually-described logic functions.

Such an oscillator circuit can also be tested with automatic methods (so-called ATPG, acronym from the English "Automatic Test Pattern Generation") and it has reduced development times and size.

Moreover, the ring oscillator circuit 10 according to an embodiment of the invention has a wide frequency variation range of the generated clock signal CK besides an extreme rapidity of the frequency variation.

Possible applications of the ring oscillator circuit realized according to the invention are completely digital frequency multipliers, to generate system clock signals, as well as completely digital FM demodulators.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A ring oscillator comprising a plurality of coupled multiplexer stages, wherein each multiplexer stage comprises:
   a multiplexer having a first input coupled to an output of a preceding multiplexer stage, a second input, an output coupled to an input of a succeeding multiplexer stage, and a control input for receiving a first control signal; and
   an OR gate having a first input for receiving a second control signal, a second input coupled to the output of the preceding multiplexer stage, and an output coupled to the second input of the multiplexer.

2. The ring oscillator circuit according to claim 1, further comprising a control block for providing the second control signal.

3. The ring oscillator circuit according to claim 2, wherein said control block comprises a bistable element.

4. The ring oscillator circuit according to claim 3, wherein said bistable element comprises a D-type flip-flop.

5. The ring oscillator circuit according to claim 2, wherein said control block outputs a control word.

6. The ring oscillator circuit according to claim 1, further comprising a delay stage interposed between the output of the OR gate and the second input of the multiplexer.

7. The ring oscillator circuit according to claim 1, further comprising a feedback circuit having an input coupled to an output of a last multiplexer stage, and an output coupled to an input of a first multiplexer stage.

8. The ring oscillator circuit according to claim 7, wherein the feedback circuit further comprises a reset circuit.

9. The ring oscillator circuit according to claim 8, wherein said feedback circuit comprises a delay stage.

10. The ring oscillator circuit according to claim 8, wherein said feedback circuit comprises a logic gate for receiving a reset signal.

11. The ring oscillator circuit according to claim 8, wherein plurality of coupled multiplex stages contains three coupled multiplex stages.

12. The ring oscillator circuit according to claim 1, wherein plurality of coupled multiplex stages contains three coupled multiplex stages.

* * * * *